United States Patent
Pogge et al.

(10) Patent No.: US 7,821,120 B2
(45) Date of Patent: Oct. 26, 2010

(54) METAL FILLED THROUGH VIA STRUCTURE FOR PROVIDING VERTICAL WAFER-TO-WAFER INTERCONNECTION

(75) Inventors: H. Bernhard Pogge, Hopewell Junction, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/971,581

(22) Filed: Jan. 9, 2008

(65) Prior Publication Data

US 2008/0105976 A1 May 8, 2008

Related U.S. Application Data

(62) Division of application No. 11/459,784, filed on Jul. 25, 2006, now Pat. No. 7,344,959.

(51) Int. Cl.
*H01L 23/04* (2006.01)
(52) U.S. Cl. ............... 257/698; 257/621; 257/686; 257/774; 257/777
(58) Field of Classification Search ............... 257/621, 257/686, 698, 774, 777
See application file for complete search history.

(56) References Cited

U.S. PATENT DOCUMENTS

| | | | | |
|---|---|---|---|---|
| 5,432,999 | A * | 7/1995 | Capps et al. | 438/109 |
| 5,646,067 | A * | 7/1997 | Gaul | 438/458 |
| 6,444,560 | B1 | 9/2002 | Pogge et al. | |
| 6,577,013 | B1 * | 6/2003 | Glenn et al. | 257/777 |
| 6,908,785 | B2 * | 6/2005 | Kim | 438/106 |
| 6,967,162 | B2 | 11/2005 | Chooi et al. | |
| 7,279,407 | B2 * | 10/2007 | Akram et al. | 438/597 |
| 7,354,798 | B2 * | 4/2008 | Pogge et al. | 438/109 |
| 7,385,283 | B2 * | 6/2008 | Wu et al. | 257/686 |
| 7,485,968 | B2 * | 2/2009 | Enquist et al. | 257/777 |
| 7,572,673 | B2 * | 8/2009 | Chung et al. | 438/113 |
| 7,605,019 | B2 * | 10/2009 | Simon et al. | 438/109 |
| 2003/0148590 | A1 | 8/2003 | Kellar et al. | |
| 2004/0238933 | A1 * | 12/2004 | Chen et al. | 257/686 |
| 2005/0051883 | A1 * | 3/2005 | Fukazawa | 257/686 |
| 2005/0110131 | A1 | 5/2005 | Lee | |

(Continued)

OTHER PUBLICATIONS

EP Official Action—Application No. 07853503.6—Jul. 28, 2009.

*Primary Examiner*—Kevin M Picardat
*Assistant Examiner*—Bac H Au
(74) *Attorney, Agent, or Firm*—Scully, Scott, Murphy & Presser, P.C.; H. Daniel Schnurmann

(57) ABSTRACT

A vertical wafer-to-wafer interconnect structure is provided in which a first wafer and a second wafer are mated by way of metal studs that extend from a surface of the first wafer. The metal studs extend from the surface of the first wafer into a corresponding through via of the second wafer. A polyimide coating is present in the through via on mated surfaces of the first and second wafers and on another surface of the second wafer not mated to the first wafer, thus the metal studs provide a continuous metal path from the first wafer through the second wafer. Since only metal studs for the vertical connection are used, no alpha radiation is generated by the metal studs.

16 Claims, 8 Drawing Sheets

U.S. PATENT DOCUMENTS

| | | |
|---|---|---|
| 2005/0260794 A1 | 11/2005 | Lo et al. |
| 2006/0097357 A1 | 5/2006 | Nemoto |
| 2006/0121690 A1 | 6/2006 | Pogge et al. |
| 2006/0208331 A1* | 9/2006 | Wada ......................... 257/432 |
| 2006/0216856 A1* | 9/2006 | Zhao .......................... 438/106 |
| 2007/0090490 A1* | 4/2007 | Chang et al. ................ 257/621 |
| 2007/0117348 A1* | 5/2007 | Ramanathan et al. ....... 438/455 |

* cited by examiner

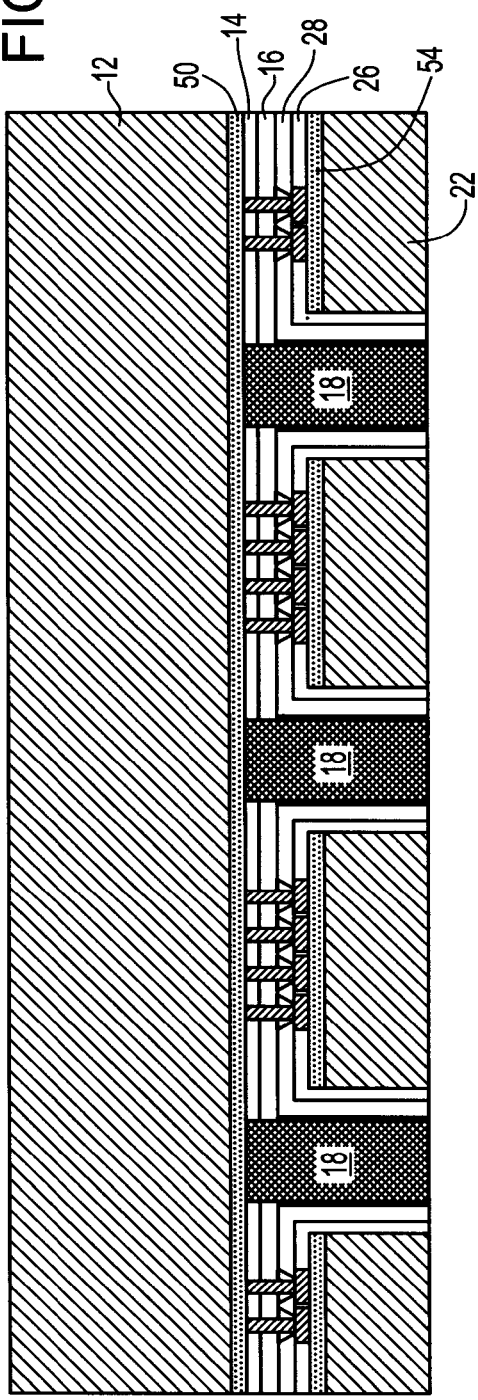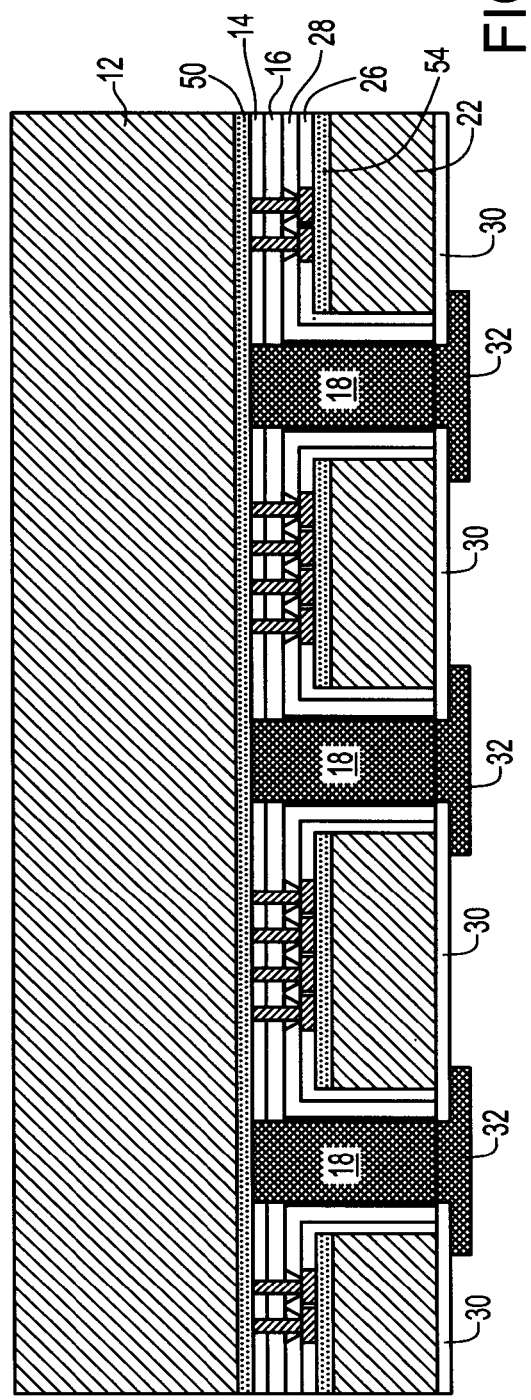

METAL FILLED THROUGH VIA STRUCTURE FOR PROVIDING VERTICAL WAFER-TO-WAFER INTERCONNECTION

FIELD OF THE INVENTION

The present invention relates to a semiconductor structure and more particularly to a reliable vertical wafer-to-wafer (or chip-to-chip) interconnect structure.

BACKGROUND OF THE INVENTION

In current semiconductor technology, there is an ongoing trend to increase the performance of a semiconductor chip by shifting from a two-dimensional (2D) chip format to a three-dimensional (3D) chip format. This requires a wafer-to-wafer (or even a chip-to-chip) vertical interconnect.

Vertical interconnects are preferably made by way of a reduced sized solder bump area array interconnect scheme, which is often called a flip-chip solder connection or C4. However, the present lead based C4s are themselves a source of alpha radiation and they typically interfere with the need for a radiation-free interconnect material. Alpha radiation is undesirable since it may introduce soft errors into the semiconductor device. It is noted that not all semiconductor designs are affected by alpha-radiation.

Furthermore, the new lead free C4s that are presently being considered consist mainly of tin (Sn), which itself may be a source of alpha radiation. Hence, these new C4s do not assure the elimination of the alpha radiation issue.

Alternative interconnection can be achieved with a metal stud-to-pad approach. This method, which is described, for example, in U.S. Pat. No. 6,444,560 to Pogge et al., is termed the T&J (transfer and join) approach. A typical T&J interconnect consists of a metal stud (preferably copper, Cu) coated with an alloying metal (typically Sn). The Sn assists the alloying of the metal stud to an opposing metal pad (typically Cu as well). As with the previously mentioned C4 technology, the T&J approach includes Sn which may also be an alpha radiation source.

To accommodate the ability to attach a second semiconductor chip to a first semiconductor chip dictates the need for a vertical through via in the second chip so that there is an electrical path from the first chip through the second chip and to a supporting substrate that is located beneath the second chip. Through via processing has been exercised by a number of semiconductor manufacturers. However, an efficient through via fabrication and through via metal filling has remained a challenge. There is a concern to assure the creation of a smooth vertical through via, rather than some form of corrugated surfaced through via. The latter may initiate metal voids within the metal filled through via which can lead to unacceptable conductivity variations.

In view of the above, there is a need for providing an alternative method for fabricating an improved metal filled through via that overcomes the above mentioned through via concerns as well as avoiding alpha radiation source issues generated by C4s or possible Sn based alloying T&J interconnects.

SUMMARY OF THE INVENTION

In a first embodiment of the present invention, there is provided a reliable metal through via that is useful in providing a vertical wafer-to-wafer (or even chip-to-chip) interconnect structure. In accordance with the present invention, the metal filled through via overcomes the above mentioned drawbacks for through via processing. Moreover, the present invention avoids alpha radiation source issues that typically are a concern when C4s or Sn based alloying T&J interconnects are used. The present invention preferably uses a metal stud for the vertical connection, such that no Sn or other alpha radiation generating sources are used in the presence of the metal studs.

In accordance with another embodiment of the present invention, the metal studs are preferably electroplated to the underside of a first semiconductor wafer (i.e., a device wafer) using standard interconnect processing. Each of the studs are then inserted into a corresponding polyimide coated through via of a second semiconductor wafer to form the inventive 3D interconnect structure. In accordance with the present invention, the second semiconductor wafer may or may not have semiconductor circuitry i.e., devices, located thereon. Thus, in accordance with an embodiment of the present invention, the second semiconductor wafer may serve as a spacer that can absorb radiation from an outside source. In yet another embodiment of the present invention, the second semiconductor wafer may have circuitry thereon. In this particular embodiment, at least one interconnect level is typically imposed between the first and second semiconductor wafers. In the foregoing discussion, it is noted that the first and second wafers can also be implied to include first and second semiconductor chips. In such an embodiment of the present invention, the inventive technology can be used in providing a vertical chip-to-chip interconnection.

The polyimide coating mentioned above serves as a bonding material which flows and encases the metal stud during a subsequent heating step. Each stud employed in the present invention is typically, but not necessarily always, designed to bud into the bottom surface of the eventual through via of the second wafer. However, budding is not required in all circumstances. That is, the height of each metallic stud may be slightly shorter than the depth of the eventual through via. Once inserted and then heated, the polyimide flows and fully encases the metal stud to serve as a stress buffer between the metal stud and a dielectric through via liner. The second wafer, once attached, is then thinned with existing planarization processes.

The inventive approach avoids the need for alloying of metal studs, yet creates a continuous metal path from the first wafer through the second wafer.

In general terms, the present invention provides a vertical wafer-to-wafer interconnect structure. More specifically, the inventive vertical wafer-to-wafer interconnect structure includes:

a first wafer and a second wafer which are mated with at least one metal stud that extends from a surface of said first wafer, said at least one metal stud extending from said surface of said first wafer into a corresponding through via of said second wafer, wherein a polyimide coating is present in said through via, on mated surfaces of said first and second wafers and on another surface of said second wafer not mated to said first wafer, and wherein said at least one metal stud provides a continuous metal path from said first wafer through said second wafer.

In another embodiment of the invention, there is provided a method of fabricating a reliable metal filled through via structure for providing vertical wafer-to-wafer interconnection that comprises the steps of:

providing a first wafer and a second wafer, said first wafer having at least one metal stud disposed on a surface thereof and said second wafer including at least one polyimide coated through via;

inserting said at least one metal stud of said first wafer into said at least one polyimide coated through via of said second wafer to provide a combined structure;

heating the combined structure to cause opposing polyimide surfaces to bond and initiate flow to fully encase each metal stud;

thinning the second wafer to expose a surface of the at least one metal stud positioned within said at least one polyimide coated through via; and forming a patterned polyimide coating on a surface of the thinned second wafer and a metal pad on said exposed surface of said at least one metal stud.

It is noted that when Si-containing wafers are employed, an oxide is generally used and appropriately patterned to protect the wafers prior to other processing, such as, for example, formation of polyimides and metal studs.

In yet another embodiment of the present invention, the method comprises the steps of:

providing a first wafer and a second wafer, said first wafer having at least one Cu stud disposed on a surface thereof and said second wafer including at least one polyimide coated through via;

inserting said at least one Cu stud of said first wafer into said at least one polyimide coated through via of said second wafer to provide a combined structure;

heating the combined structure to cause opposing polyimide surfaces to bond and initiate flow to fully encase each Cu stud;

thinning the second wafer to expose a surface of the at least one Cu stud positioned within said at least one polyimide coated through via; and forming a patterned polyimide coating on a surface of the thinned second wafer and a Cu pad on said exposed surface of said at least one Cu stud.

The methods of the present invention mentioned above avoid the need for alloying a metal stud to a metal pad, yet they create a continuous metal path from the first wafer (e.g., the device wafer) through the second wafer (attachment wafer or second device wafer).

BRIEF DESCRIPTION OF THE DRAWINGS

FIGS. 6A-6D are pictorial representations (through cross sectional views) illustrating yet another embodiment of the present invention wherein an interconnect level is disposed between a first wafer and a second wafer.

DETAILED DESCRIPTION OF EMBODIMENTS OF THE INVENTION

Figure 1:
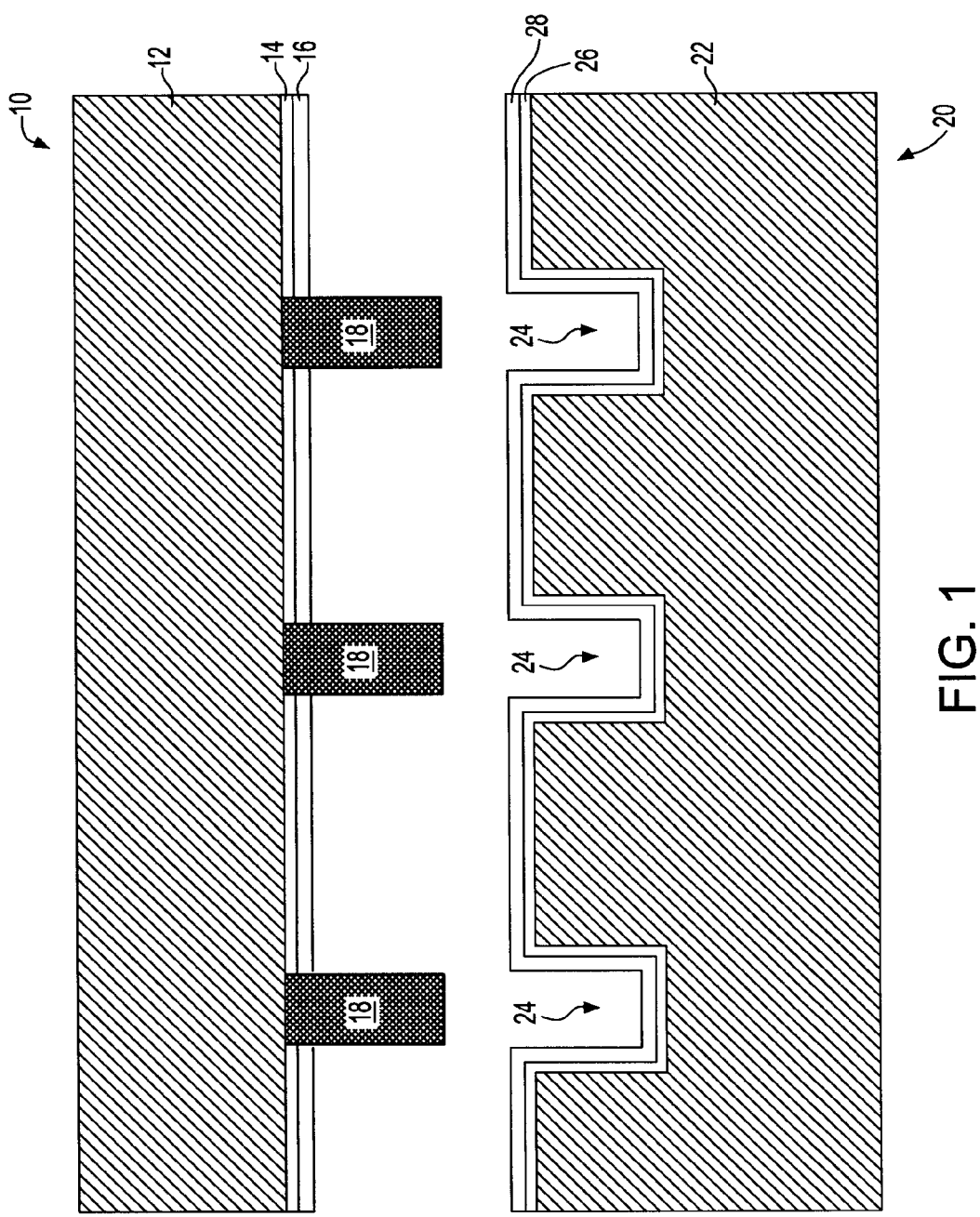
FIG. 1 is a pictorial representation (through a cross sectional view) illustrating the first wafer and the second wafer employed in the present invention.

The preferred embodiment of the present invention, which provides a vertical wafer-to-wafer interconnect structure utilizing only metal studs, will now be described in greater detail by referring to the following discussion and drawings that accompany the present application. It is noted that the drawings of the present application are provided for illustrative purposes, and as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a method of fabricating a reliable metal filled through via for providing a vertical wafer-to-wafer (or chip-to-chip) interconnect structure utilizing a modified transfer and join process wherein alloying of metal studs is avoided. In the present invention, the studs consist essentially of a conductive metal which is not an alpha radiation source. In general terms, the method of the present invention includes first providing a first wafer and a second wafer. In accordance with the present invention, the first wafer has at least one metal stud interconnect to a surface that is typically, but not necessarily always, opposite semiconductor devices and the second wafer includes at least one polyimide coated through via. The second wafer may or may not have semiconductor circuitry therein. Next, the at least one metal stud of the first wafer is inserted into the at least one polyimide coated through via of the second wafer. After full insertion, the now combined first and the second wafers are heated to a temperature that causes the opposing polyimide surfaces to bond and initiate flow to fully encase each of the metal studs. A thinning step is then performed on the second wafer to expose a surface of the at least one metal stud positioned within the at least one polyimide coated through via. Backside processing with a polyimide coating on a surface of the thinned second wafer and a metal pad on the exposed surface of the at least one metal stud is then preformed.

The inventive fabrication process described briefly above is now described in connection with FIGS. 1-4. It is noted that in these drawings the complete budding of the metal studs to the bottom of the through via is shown. Although this particular embodiment is shown, the present invention also contemplates the embodiment shown in FIGS. 5A-5C. In these drawings and in that embodiment of the present application, the metal studs are designed not to completely bud to the bottom of the through via. In addition, the present invention also contemplates an embodiment in which at least one interconnect level is disposed between the first and second wafers, both of the wafers typically contain semiconductor devices.

It is further noted that not all process details are shown in the drawings provided in the present application. For example, the insulating of the surfaces of the first and second wafers with an oxide is not always shown or described herein. Moreover, the formation of devices on the first wafer and optionally the second wafer is not shown or described in the present application. Furthermore, after performing the various processing steps of the present invention, additional processing (not shown or described in greater detail) can be performed on the underside of the second wafer. For example, a patterned oxide is typically formed on the underside of the second wafer prior to forming the contact pads. In some embodiments, wide contact pads are formed around the metal stud to assure good metal contact and larger areas for larger packaging pad attachment needs of the substrate.

Reference is now made to FIGS. 1-4 wherein a first embodiment of the present invention is shown. In this embodiment, the metal studs are designed to fully bud to the bottom of the through via. The term "fully bud" denotes that the metal studs are designed to have a height which ensures that the top surface of the metal studs comes into direct contact with the bottom wall portion of the through via. The bottom wall portion is typically lined with a through via liner which is comprised of a dielectric material and a polyimide.

FIG. 1 illustrates a first step of the present invention in which a first wafer (hereinafter the device wafer) 10 and a second wafer (hereinafter the attachment wafer) 20 are provided. In accordance with this embodiment of the present invention, the device wafer 10 is the wafer in which at least one semiconductor device (not shown) is formed, while the attachment wafer 20 is a spacer that can be used to absorb alpha radiation from outside sources, such as from C4s and/or ceramic substrates. As illustrated in FIG. 1, the device wafer 10 includes a first semiconductor substrate 12 which has a patterned first dielectric material 14 located on a surface thereof. The patterned first dielectric material 14 is similarly patterned with a polyimide coating 16 or other like bonding material located thereon. As is shown, the device wafer 10 also includes at least one metal stud 18 located on a surface of the first semiconductor substrate 12 which is disposed between the patterned first dielectric material 14 and the polyimide coating 16.

The attachment wafer 20 includes a second semiconductor substrate 22 which has at least one through via 24 formed therein. It is noted that the at least one through via 24 does not typically extend entirely through the attachment wafer at this point of the present application. The attachment wafer 20 also includes a second dielectric material 26 that lines the exposed surfaces (including bottom and sidewalls) of the at least one through via 24 as well as the surfaces of the second semiconductor substrate 22 located between adjacent through vias. A polyimide coating 28 is disposed on the second dielectric material 26 so as to cover the dielectric material that is present on the sidewalls of the at least one through via 24 and the exposed surface of the second substrate 22 adjacent the through vias 24.

The device wafer 10 is fabricated utilizing techniques that are well known to those skilled in the art. For example, after substrate and device processing, a first dielectric material 14 is applied to a surface of the first semiconductor substrate 12 that is typically opposite the semiconductor devices. The first semiconductor substrate 12 comprises any semiconducting material including, but not limited to: Si, Ge, SiGe, SiC, SiGeC, Ga, GaAs, InAs, InP and all other III/V or II/VI compound semiconductors. First semiconductor substrate 12 may also comprise an organic semiconductor or a layered semiconductor such as Si/SiGe, silicon-on-insulator (SOI) or a SiGe-on-insulator (SGOI). In some embodiments of the present invention, it is preferred that the first semiconductor substrate 12 be composed of a Si-containing semiconductor material, i.e., a semiconductor material that includes silicon. The first semiconductor substrate 12 may be doped, undoped or contain doped and undoped regions therein.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The first semiconductor substrate 12 may have a single crystal orientation or alternatively hybrid semiconductor substrates having surface regions of different crystal orientations can also be employed. The hybrid substrate allows for fabricating a device upon a specific crystal orientation that enhances the performance of the specific device formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

The first dielectric material 14 is comprised of an oxide, oxynitride, nitride or multilayers thereof. In one embodiment of the present invention, the first dielectric material 14 is comprised of an oxide such as, for example, $SiO_2$. The first dielectric material 14 is formed by a conventional deposition process such as, for example, chemical vapor deposition (CVD), plasma enhanced chemical vapor deposition (PECVD), atomic layer deposition (ALD), evaporation, chemical solution deposition and other like deposition techniques. Alternatively, the first dielectric material 14 may be formed by a thermal process such as, for example, oxidation, nitridation or a combination thereof.

The thickness of the first dielectric material 14 may vary depending on the technique used in forming the same as well as the type of dielectric material used. Typically, the first dielectric material 14 has a thickness from about 100 to about 2000 nm, with a thickness from about 500 to about 1000 nm being more highly preferred.

A thermoplastic polyimide (hereinafter just "polyimide") coating 16 is formed on top of the first dielectric material 14. The polyimide coating 16 is formed utilizing a conventional deposition process including, for example, CVD, PECVD, evaporation and spin-on coating. The polyimide coating 16 serves as an adhesive or bonding agent for attaching the device wafer 10 to the attachment wafer 20. The polyimide coating 16 typically has an as-deposited thickness from about 500 to about 10,000 nm, with a thickness from about 1000 to about 3000 nm being even more typical.

A thermoplastic polyimide is a preferred material employed in the present invention since it is malleable, can absorb stress and tends to have a coefficient thermal expansion (CTE) that is greater than the CTE of the semiconductor substrates employed in the present application.

After forming the first dielectric material 14 and the polyimide coating 16, a patterned photoresist (not shown) is disposed on the either the exposed surface of the first dielectric material 14 (if the polyimide coating is not present) or atop the polyimide coating 16 (if the polyimide coating is present). The patterned photoresist is formed by deposition and lithography. The deposition step includes a conventional deposition process including, for example, CVD, PECVD, spin-on coating and evaporation. The lithographic process includes exposing the applied photoresist to a pattern of radiation and developing the exposed resist utilizing a conventional resist developer. The patterned photoresist includes openings that expose the upper surface of either layer 16 or layer 14. The exposed material within these openings is then removed utilizing an etching process. Dry etching (including reactive ion etching, ion beam etching, plasma etching and laser ablation), wet etching or any combination thereof may be utilized. The etching provides openings to the first semiconductor substrate 12 in which the at least metal studs 18 are formed. After etching, the patterned photoresist is stripped utilizing a conventional resist developer.

The metal studs 18 are then formed into the openings utilizing any conventional electroplating process that is well known to those skilled in the art. As is known by those skilled in the art, the metal studs 18 are in contact with either Cu pads or a patterned protective layer that may be present on the device wafer 10. Neither the Cu pads, nor the patterned protective material is shown in the drawings of the present application. In accordance with the present invention, the metal studs 18 are comprised of a conductive metal that is not a source of alpha radiation. Examples of conductive metals that are non-alpha radiation source materials include, for example, Cu, Al, W and Au. Of the various conductive metals listed above, it is preferred in some embodiments that the conductive metal be comprised of Cu.

Figure 5A:
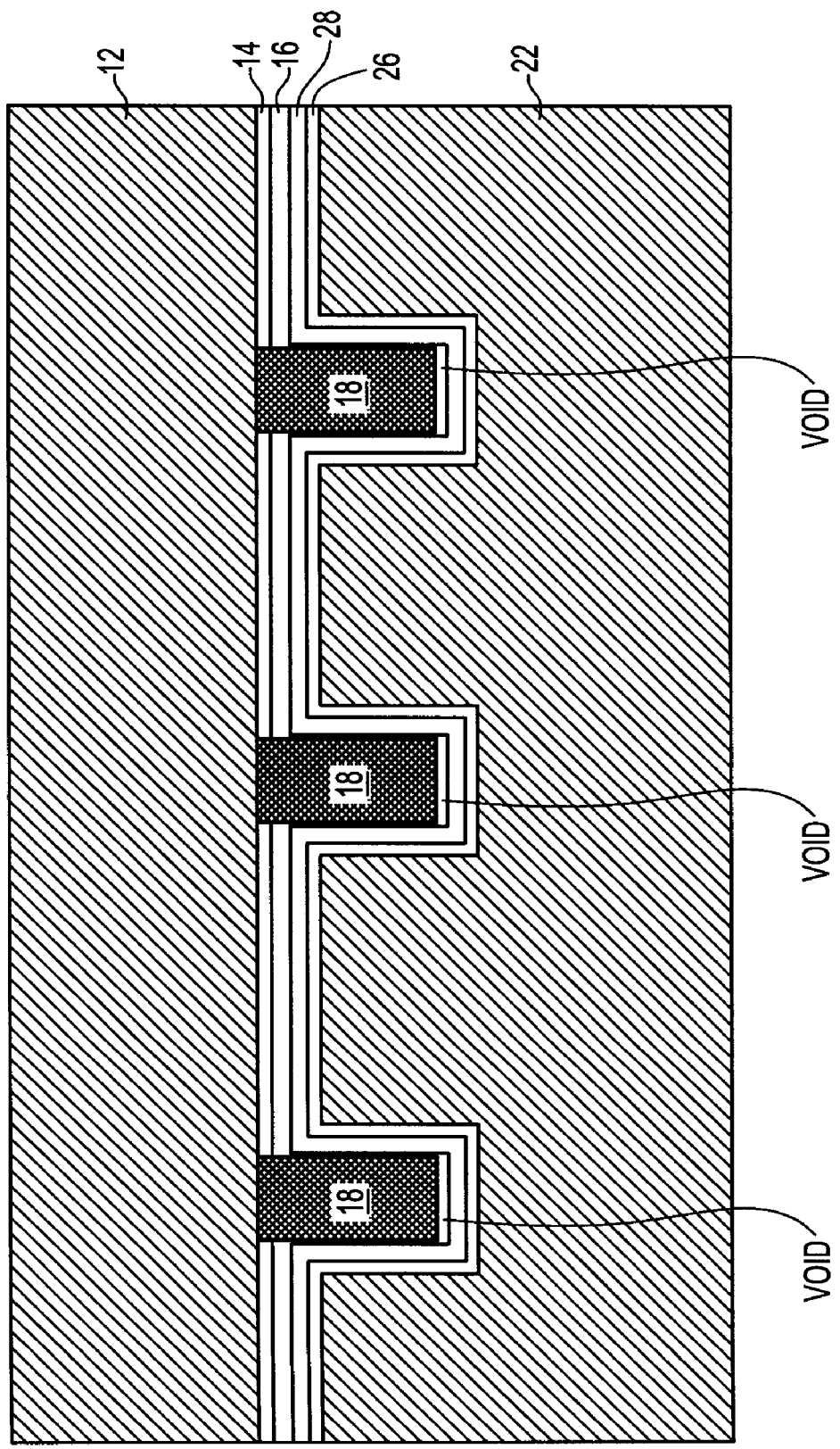
FIGS. 5A-5C are pictorial representations (through cross sectional views) illustrating an alternative embodiment wherein the metal studs are not designed to completely bud to the bottom of the through via.
Figure 5B:
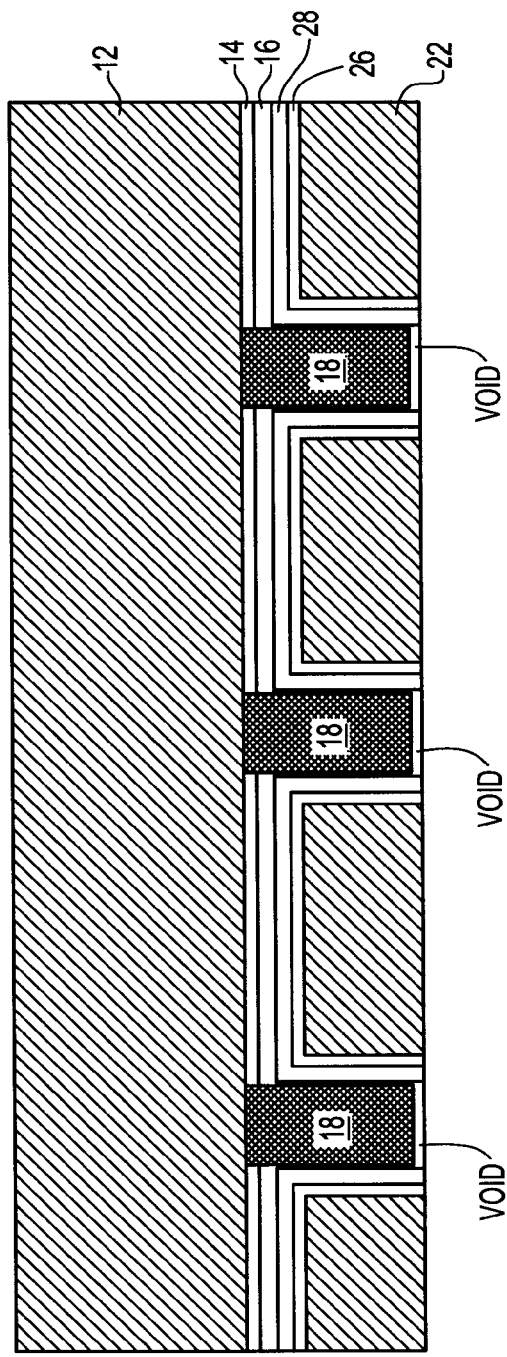
Figure 5C:
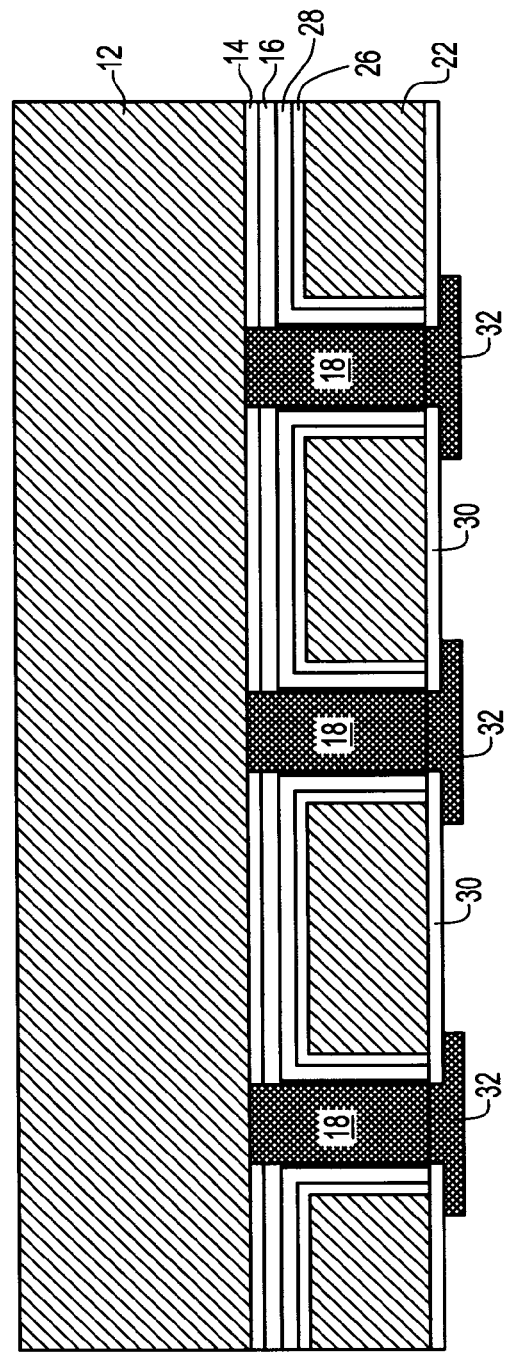

The height of the metallic studs 18 formed can be designed to either bud to the bottom wall portion of the through via of the attachment substrate, or not to bud to the bottom wall portion of the through via. The former embodiment of the present invention is shown in these drawings, while FIGS. 5A-5C show the latter embodiment of the present invention.

As stated above and as shown in FIG. 1, the attachment wafer 20 includes a second semiconductor substrate 22 that has a least one polyimide coated through via. The second semiconductor substrate 22 may comprise the same or different semiconductor material as the first semiconductor substrate 12 of the device wafer 10. Typically, the second semiconductor substrate 22 is a Si-containing semiconductor substrate.

At least one through via 24 is then formed into the second semiconductor substrate 22 of the attachment wafer 20 utilizing conventional lithography and etching, both of which have been described above. As previously indicated, the through vias 24 that are formed at this point of the present invention do not typically extend through the entire thickness of the second semiconductor substrate 22. After through via formation, the resist used in forming the same is stripped utilizing a conventional resist stripping process well known to those skilled in the art.

After providing the at least one through via 24, a dielectric material 26 is then formed on all exposed surfaces (sidewalls and bottom wall) of the through vias 24 as well as the exposed surface of the second substrate 22 that lies adjacent to said through vias 24. The dielectric material 26 which serves as a through via liner in the attachment wafer 20 may comprise the same or different dielectric material as the first dielectric material 14 of the device wafer. In some embodiments, it is preferred that the dielectric material 26 be comprised of an oxide such as, for example, $SiO_2$. It is noted that the dielectric material 26 can be formed utilizing one of the above mentioned techniques described for the first dielectric material 14 and the thickness of the dielectric material 26 can fall within the ranges mentioned above for the first dielectric material 14.

Next, a thermoplastic polyimide (hereinafter just "polyimide") coating 28 is formed on sidewall surfaces of the dielectric material 26 which are located within the at least one through via 24 as well as atop the dielectric material 26 that is located on the portions of the second semiconductor substrate 22 that are adjacent to said through vias 24. The polyimide coating 28 is formed as described above and its thickness is within the ranges mentioned above as well.

After providing the device wafer 10 and the attachment wafer 20 as described above and as shown in FIG. 1, these two wafers are brought together such that the at least one metal stud 18 is inserted into the at least one through via 24. The resultant combined structure that is formed after insertion is shown, for example in FIG. 2. It is noted that in this particular embodiment of the present invention, the metal studs 18 bud to the bottom wall portion of the through vias 24. That is, an upper surface of each of the metal studs 18 comes into intimate contact with the second dielectric material 26 that is present in the through vias 24. The insertion process is performed by applying an external force to at least one of the device wafer 10 or the attachment wafer 20, or more preferably both wafers.

Figure 2:
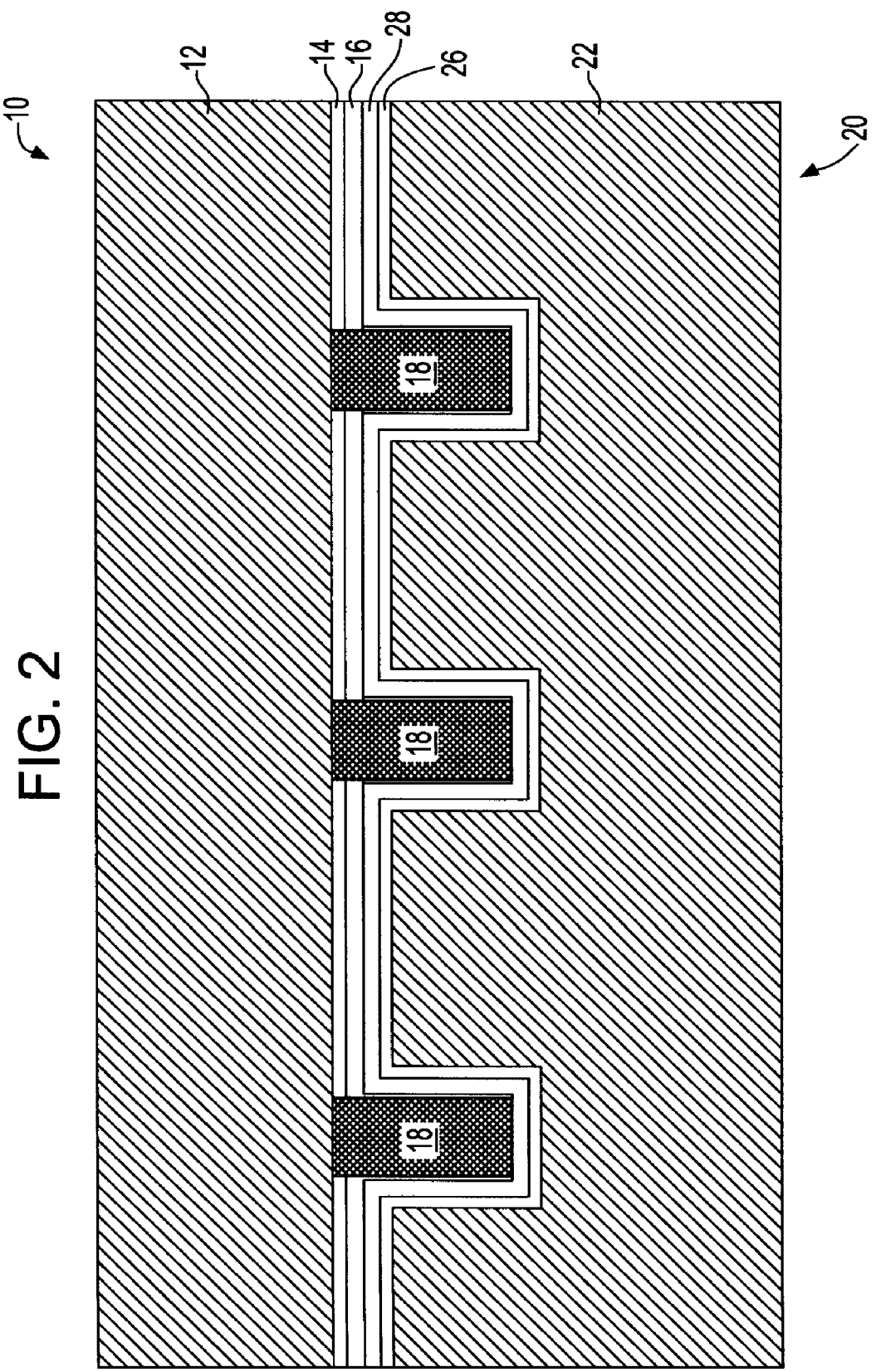
FIG. 2 is a pictorial representation (through a cross sectional view) illustrating the structure after inserting the metal studs disposed on the backside of the first wafer into polyimide coated through vias formed in the second wafer.

After providing the combined structure shown in FIG. 2, it is heated to a temperature that causes bonding of the opposing polyimide surfaces and simultaneous flow of the polyimide to fully encase each of the metal studs 18. This heating step of the present application is performed at a temperature which is capable of achieving polyimide flow and metal stud encasement without damaging the devices that are present in the device wafer 10. Specifically, flow of the polyimide and encasement of the metal studs, without damaging the devices present in the device wafer 10, is achieved by heating the structure shown in FIG. 2 to a temperature that is less than about 400° C. More typically, the heating step of the present invention is performed at a temperature from about 250° to about 375° C. The time period of this heating step may vary and is dependent on the type of heating technique used.

In accordance with the present invention, the heating step is performed in the presence of an inert ambient and subsequently under pressure. Examples of inert ambients that can be used in the present invention include He, Ar, Ne, Xe and mixtures thereof such as a mixture of He and Ar.

It is noted that during the heating step an external force may be applied to one or both wafers being transferred and joined together.

After heating, the polyimide coating hardens and entraps the at least one metal studs within the at least one through via of the second wafer.

Figure 3:
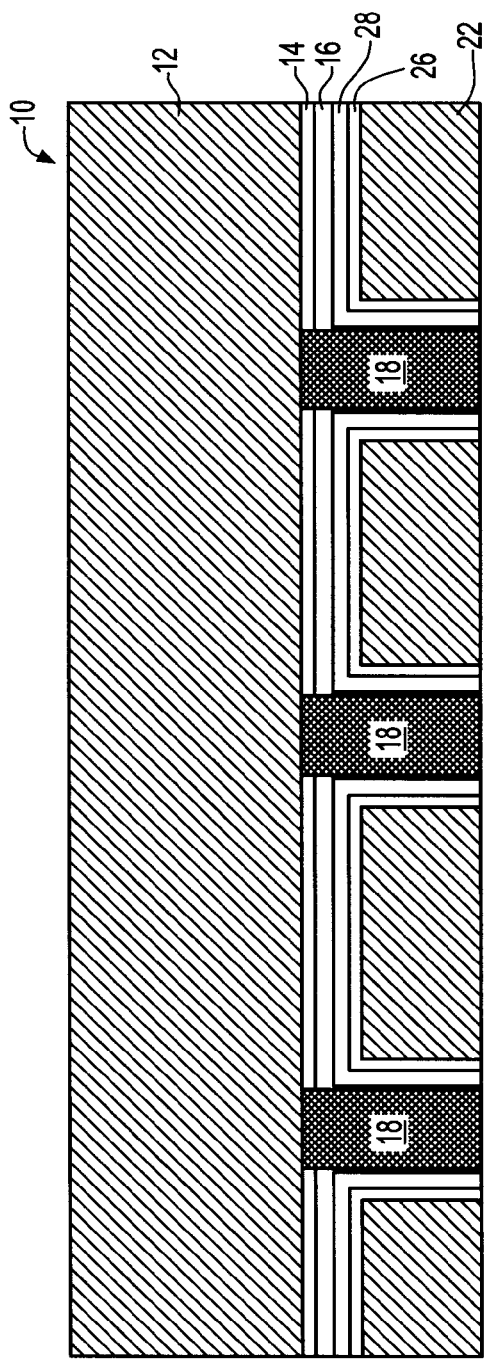
FIG. 3 is a pictorial representation (through a cross sectional view) illustrating the structure of FIG. 2 after attachment and thinning.

After joining the two wafers together utilizing the above processing steps, the backside of the attachment wafer is then thinned utilizing a conventional planarization process providing the structure shown, for example, in FIG. 3. As is shown in FIG. 3, the thinning of the attachment wafer 20 exposes a surface of the at least one metal stud 18 positioned within said at least one polyimide coated 28 through via 24. Conventional planarization processes that can be used in the present invention for the thinning of the attachment wafer 20 include grinding and/or chemical mechanical polishing (CMP). A wet chemical etching process may also be used alone or in conjunction with grinding and/or CMP to thin the attached wafer 20.

Figure 4:
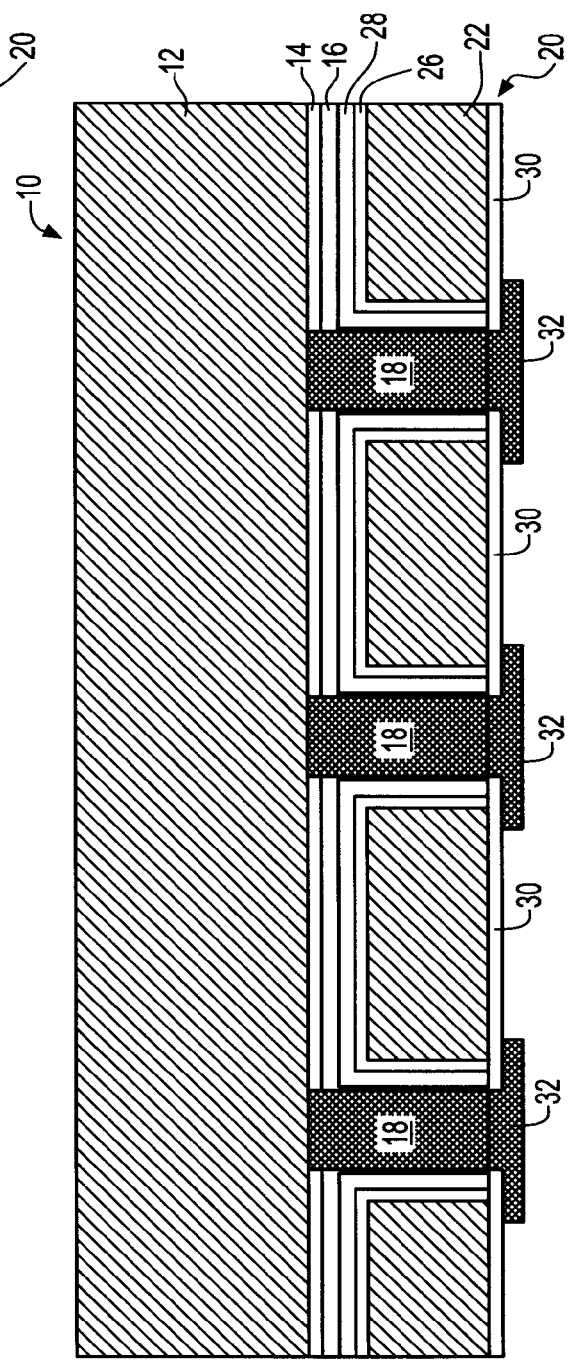
FIG. 4 is a pictorial representation (through a cross sectional view) illustrating the structure of FIG. 3 after backside processing with a polyimide and metal pads.

FIG. 4 shows the structure that is formed after backside processing with another polyimide coating 30 and metal pad 32. The polyimide coating 30 is formed as described above. The metal pad 32 which comprises preferably Cu or another like metal is formed by various deposition techniques, lithography and etching.

It is noted that the backside polyimide coating 30 assists in filling in any possible remaining voids along the stud sidewalls within the through via. The specific geometry of the stud and through via may also be altered to create a "funneled" via (not shown) and a tapered metal stud (also not shown). Process sequence details may also be altered as to specific needs and designs.

Reference is now made to FIGS. 5A-5C which illustrates another embodiment of the present application. In this embodiment, the metal studs 18 are designed to have a height that does not bud into the bottom wall portion of the through via 24. FIG. 5A shows the initial two wafers 10 and 20, respectively after insertion and joining. FIG. 5B shows the structure after thinning of the attachment wafer 20. FIG. 5C shows the structure that is formed after backside processing with another polyimide coating 30 and metal pad 32. The polyimide coating 30 is formed as described above. It is noted that all the materials and processing details for this second embodiment are the same as described above except that the height of the metal studs is designed to be shorter than that used in the embodiment shown in FIGS. 1-4. This particular embodiment, illustrates that the height of the initial metal studs 18 used in the present invention is not critical in forming a vertical interconnect structure.

In the above two embodiments, the second wafer 20 does not include any semiconductor circuitry, i.e., devices, thereon. In those embodiments, the second wafer 20 merely serves as a spacer between the first wafer 10 and a module (not shown). The purpose of the spacer, i.e., second wafer 20, is to absorb any alpha radiation emissions which may be emanating from an intimate and/or neighboring C4 connection, which is used to interconnect the module to the inventive structure.

Figure 6A:
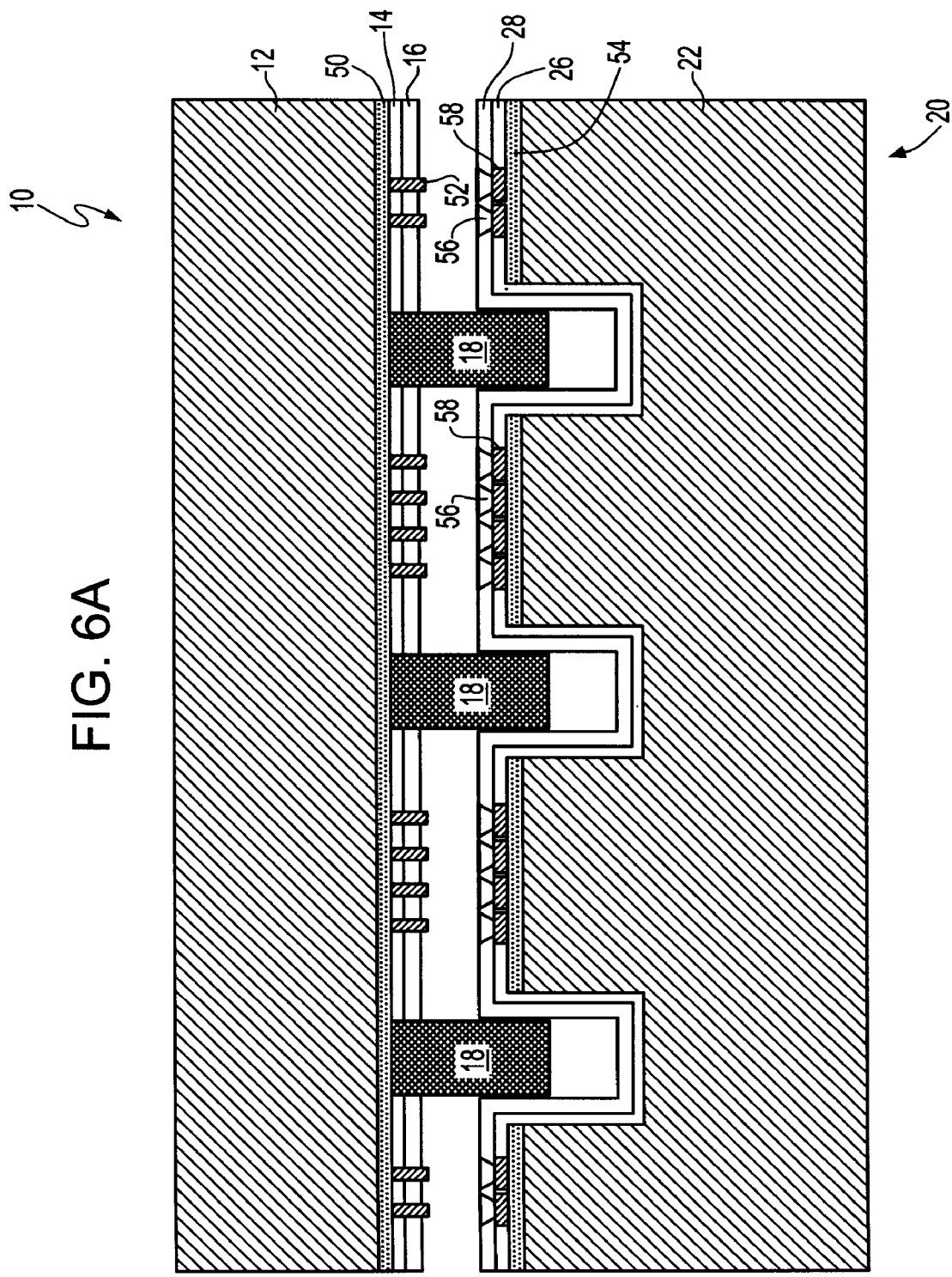

Reference is now made to FIGS. 6A-6D which represent another embodiment of the present application. In this embodiment of the present invention, the invention structure includes at least one interconnect level disposed between first and second wafers which both include semiconductor devices. FIG. 6A illustrates a first wafer 10 that includes a device region 50 located on a surface of a semiconductor substrate 12. The device region 50 includes one or more semiconductor devices. The first wafer 10 also includes metal studs 18, the first dielectric layer 14 and the polyimide coating 16. Metal contacts 52 are also shown within layers 14 and 16. The metal contacts 52 are in contact with selective areas of the semiconductor devices, for example, the source/drain regions and gates of a field effect transistor. The first wafer 10 shown in FIG. 6A is fabricated by first forming the semiconductor devices (not shown) on the substrate 12. Next, the first dielectric layer 14, the polyimide coating 16 and the contact studs 18 are formed as described above, and thereafter, metal contact openings are formed by lithography and etching. A contact metal, such as Cu, Al, W or AlCu is then formed within the contact opening utilizing a conventional deposition process. The contact metal typically extends outside the contact openings. Alternatively, the metal contacts 52 can be fabricated before the metal studs 18.

FIG. 6A also shows the presence of a second wafer 20 which includes a second semiconductor substrate 22 which includes a semiconductor device region 54 located on a surface thereof. The second wafer 20 also includes at least one through via 24, second dielectric material 26, polyimide coating 28, contact openings 56 and contact pads 58. The contact pads 58 are comprised of conventional metals well known in the art including, for example, Cu. The second wafer 20 shown in FIG. 6A is formed by first forming the semiconductor device region 54 and metal contact pads 58 on the second substrate 22, and thereafter forming the at least one via opening 24 as described above. In some embodiments of the present invention, the aforementioned processing sequence can be reversed. Next, layers 26 and 28 are formed utilizing the techniques described herein above for those layers and thereafter the contact openings 56 are formed by lithography and etching.

Figure 6B:
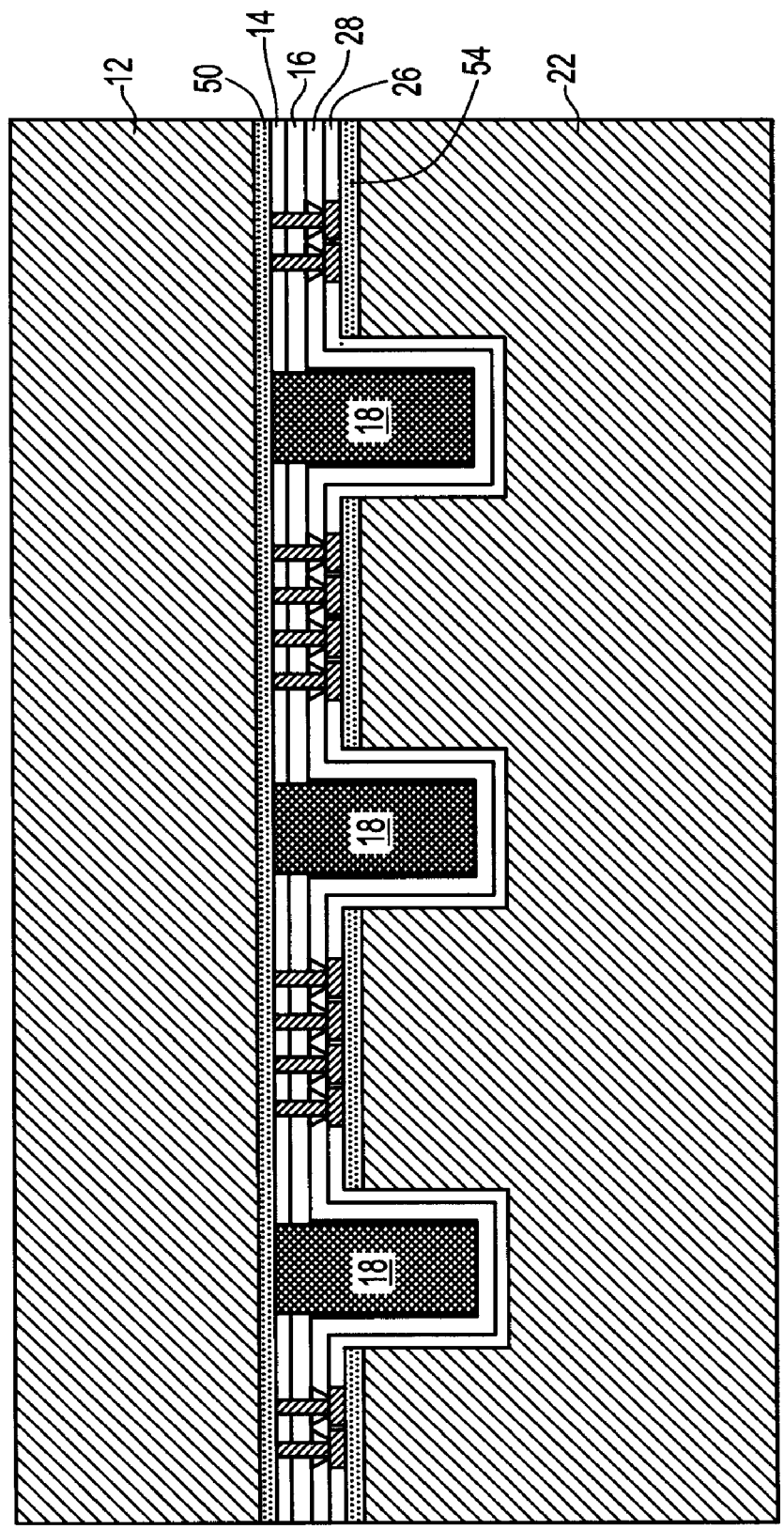

FIG. 6B shows the structure after the two wafers illustrated in FIG. 6A are brought together and heated as described above. It is noted that an interconnect level including the contact pads 58, metal contacts 52, and first and second dielectrics 14 and 26 is disposed between the first and second wafers. In this embodiment of the present invention, simultaneous bonding of the contact pads 58 to metal contacts 52 is achieved by the T&J interconnect technique described above, followed with the insertion of metallic studs 18 encasement.

FIG. 6C shows the structure after the second wafer 20 has been thinned utilizing the above mentioned processing techniques.

FIG. 6D shows the structure after backside processing with another polyimide coating 30 and a metal pad 32 utilizing the techniques described above.

While the present invention has been particularly shown and described with respect to preferred embodiments thereof, it will be understood by those skilled in the art that the foregoing and other changes in forms, structures, process sequence and details may be made without departing from the spirit and scope of the present invention. It is therefore intended that the present invention not be limited to the exact forms and details described and illustrated, but fall within the scope of the appended claims.

What is claimed is:

1. A vertical wafer-to-wafer interconnect structure comprising:
    a first wafer and a second wafer which are mated with at least one metal stud that extends from a surface of said first wafer into a corresponding through via of said second wafer, wherein a polyimide coating is present in said through via, on mated surfaces of said first and second wafers and directly on an exposed semiconductor surface of said second wafer not mated to said first wafer, and wherein said polyimide coating that is located directly on the exposed semiconductor surface of said second wafer has at least one edge that is in contact with a vertical edge of said at least one metal stud, and said at least one metal stud provides a continuous metal path from said first wafer through said second wafer.

2. The vertical wafer-to-wafer interconnect structure as recited in claim 1 wherein said first wafer and said second wafer comprise the same or different semiconductor material.

3. The vertical wafer-to-wafer interconnect structure as recited in claim 2 wherein said first wafer and said second wafer each comprise a Si-containing semiconductor.

4. The vertical wafer-to-wafer interconnect structure as recited in claim 1 wherein a dielectric material lines sidewalls of each of said through vias.

5. The vertical wafer-to-wafer interconnect structure as recited in claim 4 wherein said dielectric material is an oxide.

6. The vertical wafer-to-wafer interconnect structure as recited in claim 1 further comprising a metal pad on each exposed surface of said at least one metal stud, said metal pad is located atop a portion of said polyimide coating that is located directly on an exposed semiconductor surface of said second wafer.

7. The vertical wafer-to-wafer interconnect structure as recited in claim 6 wherein said metal pad is comprised of Cu and each of said metal studs are comprised of Cu.

8. The vertical wafer-to-wafer interconnect structure as recited in claim 1 wherein said at least one metal stud comprises a conductive metal selected from the group consisting of Cu, Al, W, and Au.

9. The vertical wafer-to-wafer interconnect structure as recited in claim 8 wherein said conductive metal is Cu.

10. The vertical wafer-to-wafer interconnect structure as recited in claim 1 wherein said first wafer includes semiconductor devices disposed on a surface of a semiconductor substrate.

11. The vertical wafer-to-wafer interconnect structure as recited in claim 1 wherein said second wafer includes semiconductor devices disposed on a surface of another semiconductor substrate, and said first and second wafer are separated by an interconnect level.

12. The vertical wafer-to-wafer interconnect structure as recited in claim 1 wherein said metal studs are electroplated to an underside of said first semiconductor wafer.

13. The vertical wafer-to-wafer interconnect structure as recited in claim 1 wherein each of said studs inserted into said polyimide coated through via of said second wafer from a three-dimensional interconnect structure.

14. The vertical wafer-to-wafer interconnect structure as recited in claim 1 wherein said second wafers absorbs radiation from an outside radiation source.

15. The vertical wafer-to-wafer interconnect structure as recited in claim 1 wherein circuitry is formed on said second wafer.

16. The vertical wafer-to-wafer interconnect structure as recited in claim 1 wherein said first and second wafers are replaced to include first and second semiconductor chips.

* * * * *